United States Patent
Heo et al.

(10) Patent No.: US 9,349,802 B2
(45) Date of Patent: May 24, 2016

(54) MEMORY DEVICES INCLUDING TWO-DIMENSIONAL MATERIAL, METHODS OF MANUFACTURING THE SAME, AND METHODS OF OPERATING THE SAME

(71) Applicant: Samsung Electronics Co., Ltd., Suwon-Si, Gyeonggi-Do (KR)

(72) Inventors: Jin-seong Heo, Seoul (KR); Seong-jun Park, Seoul (KR); Hyeon-jin Shin, Suwon-si (KR); Jae-ho Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/265,965

(22) Filed: Apr. 30, 2014

(65) Prior Publication Data

US 2015/0155287 A1    Jun. 4, 2015

(30) Foreign Application Priority Data

Nov. 29, 2013    (KR) ........................ 10-2013-0147992

(51) Int. Cl.
*H01L 27/108*    (2006.01)
*H01L 21/336*    (2006.01)
(Continued)

(52) U.S. Cl.
CPC ...... *H01L 29/1606* (2013.01); *H01L 29/66015* (2013.01); *H01L 45/149* (2013.01); *G11C 13/0014* (2013.01); *G11C 13/025* (2013.01); *G11C 2213/35* (2013.01)

(58) Field of Classification Search
CPC .................. H01L 29/66015; H01L 29/1606
USPC .......... 438/283, 195, 176, 156–158; 257/296
See application file for complete search history.

(56) References Cited

U.S. PATENT DOCUMENTS 8,232,561 B2 *  7/2012  Rinzler et al. ............... 257/79
9,105,556 B2    8/2015  Heo et al.
(Continued)

FOREIGN PATENT DOCUMENTS

JP    2015-061042    *  9/2013   .......... H01L 21/3205
KR    2012-0118566 A    10/2012
(Continued)

OTHER PUBLICATIONS

Choi, M. S. et al., "Controlled Charge Trapping by Molybdenum Disulphide and Graphene in Ultrthin Heterostructured Memory Devices." Nature Communications, Mar. 27, 2013, pp. 1-7.

(Continued)

*Primary Examiner* — Calvin Lee
(74) *Attorney, Agent, or Firm* — Harness, Dickey & Pierce, P.L.C.

(57) ABSTRACT

Disclosed are memory devices including a two-dimensional (2D) material, methods of manufacturing the same, and methods of operating the same. A memory device may include a transistor, which includes graphene and 2D semiconductor contacting the graphene, and a capacitor connected to the transistor. The memory device may include a first electrode, a first insulation layer, a second electrode, a semiconductor layer, a third electrode, a second insulation layer, and a fourth electrode which are sequentially arranged. The second electrode may include the graphene, and the semiconductor layer may include the 2D semiconductor. Alternatively, the memory device may include first and second electrode elements, a graphene layer between the first and second electrode elements, a 2D semiconductor layer between the graphene layer and the first electrode element, and a dielectric layer between the graphene layer and the second electrode.

23 Claims, 11 Drawing Sheets

(51) Int. Cl.
- *H01L 29/16* (2006.01)
- *H01L 29/66* (2006.01)
- *H01L 45/00* (2006.01)
- *G11C 13/00* (2006.01)
- *G11C 13/02* (2006.01)

(56) References Cited

U.S. PATENT DOCUMENTS

| | | |
|---|---|---|
| 2011/0163298 A1 | 7/2011 | Sung |
| 2013/0049120 A1 | 2/2013 | Sandhu |
| 2014/0097404 A1 | 4/2014 | Seo et al. |
| 2014/0231820 A1 | 8/2014 | Lee et al. |
| 2015/0122315 A1 | 5/2015 | Shin et al. |

FOREIGN PATENT DOCUMENTS

| | | |
|---|---|---|
| KR | 20130011593 A | 1/2013 |
| KR | 20130133830 A | 12/2013 |
| KR | 2014-0045167 A | 4/2014 |
| KR | 20140045841 A | 4/2014 |
| KR | 20140102990 A | 8/2014 |
| KR | 2015-0062878 A | 6/2015 |
| WO | WO-2012127244 A2 | 9/2012 |

OTHER PUBLICATIONS

Bertolazzi, S. et al. "*Nonvolatile Memory Cells Based on MoS$_2$/Grphene Heterostructures*." Electrical Engineering Institute, vol. 7, No. 4, 2013, pp. 3246-3252.

\* cited by examiner

< Equilibrium >

<Write>

< Erase >

< Equilibrium >

<Write>

< Erase >

< Equilibrium >

MEMORY DEVICES INCLUDING TWO-DIMENSIONAL MATERIAL, METHODS OF MANUFACTURING THE SAME, AND METHODS OF OPERATING THE SAME

RELATED APPLICATIONS

This application claims priority from Korean Patent Application No. 10-2013-0147992, filed on Nov. 29, 2013, in the Korean Intellectual Property Office, the disclosure of which is incorporated herein in its entirety by reference.

BACKGROUND

1. Field

Example embodiments relate to memory devices and methods of manufacturing and operating the same, and/or more particularly, to memory devices including a two-dimensional (2D) material and/or methods of manufacturing and operating the same.

2. Description of the Related Art

A two-dimensional (2D) material is a single-layer or half-layer solid material in which atoms form a predetermined or given crystal structure. The most well-known example of a 2D material is graphene. Graphene is a single-layer (single atomic layer) structure in which carbon atoms form a hexagonal structure. Graphene has a charge mobility (about $\sim 2 \times 10^5$ cm$^2$/Vs) which is 100 or more times faster than a charge mobility of silicon (Si), has a current density (about $10^8$ A/cm$^2$) which is 100 or more times greater than a current density of copper (Cu), and has a very high Fermi velocity ($V_F$). Thus, the graphene has drawn attention as a next-generation material that may overcome the limitations of the existing devices.

Other than research on graphene, various 2D materials having insulation properties or semiconductor properties are being researched and developed. Also, research for applying the materials to various devices is being conducted. Recently, a memory device to which graphene is applied as a floating gate material has been proposed. However, the existing memory device requires a transfer process of a 2D material such as graphene, and has a relatively complicated structure. Thus, it is not easy to manufacture the memory device, and it is difficult to apply the memory device to a large-area (large-scale) process.

SUMMARY

At least one example embodiment includes high-performance memory devices including a 2D material.

Provided are example memory devices that have a simple stacked structure including a 2D material, and that may be easily manufactured.

Provided are example high-density memory devices including a 2D material.

Provided are example memory arrays including a 2D material.

At least one example embodiment includes methods of manufacturing the memory devices.

Provided are example methods of operating the memory devices.

Additional aspects will be set forth in part in the description which follows and, in part, will be apparent from the description, or may be learned by practice of the presented embodiments.

According to at least one example embodiment, a memory device includes a transistor that includes a graphene layer and a two-dimensional (2D) semiconductor layer contacting the graphene layer; and a capacitor that is provided on the 2D semiconductor layer, wherein the memory device is configured to store data in the capacitor by using the transistor.

The transistor may include a first electrode; a second electrode separated from the first electrode and including the graphene layer; a first insulation layer between the first electrode and the second electrode; a third electrode separated from the first insulation layer, the second electrode being between the first insulation layer and the third electrode; and the 2D semiconductor layer between the second electrode and the third electrode.

At least one of the first and third electrodes may include graphene.

The first insulation layer may include a hexagonal boron nitride (h-BN), for example.

The 2D semiconductor layer may include a metal chalcogenide-based material.

The 2D semiconductor layer may be n-type semiconductor or p-type semiconductor.

The first electrode, the first insulation layer, and the second electrode may have a first width, and the 2D semiconductor layer and the third electrode may have a second width smaller than the first width.

The capacitor may include the third electrode; a fourth electrode separated from the third electrode; and a second insulation layer between the third and fourth electrodes, wherein the second insulation layer functions as a capacitor dielectric.

At least one of the third and fourth electrodes may include graphene.

The second insulation layer may include a hexagonal boron nitride (h-BN), for example.

According to another example embodiment, a memory device includes a first electrode; a second electrode separated from the first electrode and including a graphene layer; a first insulation layer between the first electrode and the second electrode; a third electrode separated from the first insulation layer, the second electrode being between the first insulation layer and the third electrode; a two-dimensional (2D) semiconductor layer between the second electrode and the third electrode; a fourth electrode separated from the 2D semiconductor layer, the third electrode being between the 2D semiconductor layer and the fourth electrode; and a second insulation layer between the third electrode and the fourth electrode.

At least one of the first, third, and fourth electrodes may include graphene.

At least one of the first and second insulation layers may include a hexagonal boron nitride (h-BN), for example.

The 2D semiconductor layer may be an n-type semiconductor or a p-type semiconductor that includes a metal chalcogenide-based material.

According to another example embodiment, a memory device includes a first electrode; a second electrode separated from the first electrode; a graphene layer between the first and second electrodes; a two-dimensional (2D) semiconductor layer between the graphene layer and the first electrode; and a capacitor dielectric layer between the graphene layer and the second electrode, wherein the memory device is configured to store data by charging the dielectric layer with electric charge.

At least one of the first and second electrodes may include graphene.

The 2D semiconductor layer may be n-type semiconductor or p-type semiconductor that includes a metal chalcogenide-based material.

The dielectric layer may include a hexagonal boron nitride (h-BN), for example.

According to another example embodiment, a memory array includes a plurality of first electrode lines separated from each other; a plurality of second electrode lines crossing the plurality of first electrode lines; and a memory cell provided at each of cross points between the plurality of first electrode lines and the plurality of second electrode lines, wherein the memory cell includes a graphene layer between the first and second electrode lines; a capacitor dielectric layer between the graphene layer and one of the first and second electrode lines; and a two-dimensional (2D) semiconductor layer between the graphene layer and the other of the first and second electrode lines.

The 2D semiconductor layer may be an n-type semiconductor or a p-type semiconductor that includes a metal chalcogenide-based material.

The dielectric layer may include a hexagonal boron nitride (h-BN), for example.

An electrode line adjacent to the 2D semiconductor layer among the first and second electrode lines may include a material having a work function greater than a work function of the graphene layer.

An energy band of the 2D semiconductor layer may have an asymmetric barrier structure in an equilibrium state.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
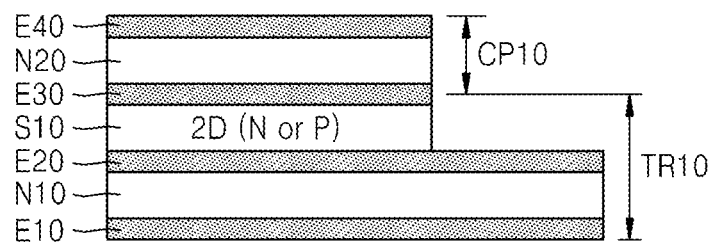
FIG. 1 is a cross-sectional view illustrating a memory device according to at least one example embodiment.

Reference will now be made in detail to example embodiments, illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain embodiments of the present description. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

It will be understood that when an element is referred to as being "on, "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. Hereinafter, memory devices including 2D material(s), methods of manufacturing the same, and methods of operating the same, according to example embodiments, will be described in detail with reference to the accompanying drawings. In the drawings, the thicknesses and widths of layers or regions are exaggerated for convenience of description and clarity of the specification. Like reference numerals denote like elements throughout the drawings.

FIG. 1 is a cross-sectional view illustrating a memory device according to an example embodiment.

Referring to FIG. 1, the memory device according to at least one example embodiment may include a transistor TR10 and a capacitor CP10 connected to the transistor TR10. The transistor TR10 may have a structure in which a plurality of electrodes E10, E20 and E30 are vertically separated from each other, and the capacitor CP10 may have a structure in which a plurality of electrodes E30 and E40 are vertically separated from each other. The transistor TR10 and the capacitor CP10 may be vertically arranged. When it is assumed that the transistor TR10 is 1T and the capacitor CP10 is 1C, the memory device may have a 1T-1C structure. The 1T-1C structure may be a vertical 1T-1C structure.

The transistor TR10 may include a 2D material. In more detail, the transistor TR10 may include an electrode (hereinafter referred to as a second electrode) E20 including a graphene layer, and a 2D semiconductor layer S10 contacting the graphene layer. The second electrode E20 may be a graphene layer. The second electrode E20 may include about one to ten layers (or about one to five layers) of graphene. That is, the second electrode E20 may be formed of single-layer graphene, or may have a stack of a plurality of graphene layers less than or equal to about 10 layers (or about 5 layers). The graphene layer may be a 2D conductive layer. The 2D semiconductor layer S10 may contact the graphene layer. The 2D semiconductor layer S10 may include, for example, a metal chalcogenide-based material. Therefore, the transistor TR10 may have a structure in which different 2D materials are bonded to each other, namely, a structure in which the graphene layer (the second electrode) E20 is bonded to the 2D semiconductor layer S10. The turn-on/off of the transistor TR10 may be controlled by adjusting an electrical barrier between the graphene layer (the second electrode) E20 and the 2D semiconductor layer S10.

The structure of the transistor TR10 will now be described in more detail.

The transistor TR10 may include first to third electrodes E10, E20 and E30 that are sequentially arranged in a vertical direction. Also, the transistor TR10 may include a first insulation layer N10 that is formed between the first and second electrodes E10 and E20, and the 2D semiconductor layer S10 that is formed between the second and third electrodes E20 and E30. The first electrode E10 may be a gate electrode, the second electrode E20 may be a source electrode, and the third electrode E30 may be a drain electrode. The source electrode and the drain electrode may be functionally switched with one another. In other words, the second electrode E20 may be the drain electrode, and the third electrode E30 may be the source electrode. The third electrode E30 may be a floated electrode. As described above, the second electrode E20 may include graphene. At least one of the first and third electrodes E10 and E30 may include graphene. All of the first and third electrodes E10 and E30 may include graphene. All of the first to third electrodes E10, E20 and E30 may include graphene. However, as needed, at least one of the first and third electrodes E10 and E30 may include a different conductive material than graphene such as, for example, a metal or metal compound. The first insulation layer N10 may be a gate insulating layer. The first insulation layer N10 may be formed of an insulating 2D material such as hexagonal boron nitride (h-BN). However, as needed, the first insulation layer N10 may be formed of another material instead of a 2D material such as, for example, an insulating material such as $SiO_2$, $SiN_x$, AlN, $Al_2O_3$, $HfO_2$, $ZrO_2$, or the like. All materials available as the gate insulating layer may be applied as a material of the first insulation layer N10.

The 2D semiconductor layer S10 may include a metal chalcogenide-based material. The metal chalcogenide-based material may be a transition metal dichalcogenide (TMDC) material. In this case, the metal chalcogenide-based material may include one transition metal of molybdenum (Mo), tungsten (W), niobium (Nb), vanadium (V), tantalum (Ta), titanium (Ti), zirconium (Zr), hafnium (Hf), technetium (Tc), and rhenium (Re) and one chalcogen element of sulfur (S), selenium (Se), and tellurium (Te). The TMDC material may be expressed as, for example, $MX_2$. Here, M is transition metal, and X is a chalcogen element. M may be Mo, W, Nb, V, Ta, Ti, Zr, Hf, Tc, or Re, and X may be S, Se, or Te. The TMDC material may be, for example, $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, or $ReSe_2$. The metal chalcogenide-based material may not be expressed as $MX_2$. For example, a compound (a transition metal chalcogenide material) of Cu (which is transition metal) and S (which is a chalcogen element) may be expressed as CuS. CuS may be a 2D material, and thus may be applied as the metal chalcogenide-based material. As another example, the metal chalcogenide-based material may be a chalcogenide material containing non-transition metal. The non-transition metal may be, for example, gallium (Ga), indium (In), tin (Sn), germanium (Ge), or lead (Pb). That is, a compound of non-transition metal, such as Ga, In, Sn, Ge, or Pb, and a chalcogen element, such as S, Se, or Te, may be used as the metal chalcogenide-based material. The metal chalcogenide-based material containing non-transition metal may be, for example, $SnSe_2$, GaS, GaSe, GaTe, GeSe, $In_2Se_3$, or $InSnS_2$. The 2D semiconductor layer S10 may be an n-type semiconductor or a p-type semiconductor. When the 2D semiconductor layer S10 is the n-type semiconductor, the 2D semiconductor layer S10 may include at least one of $MoS_2$, $MoSe_2$, MoTe2, $WSe_2$, and $WTe_2$, as the metal chalcogenide-based material having n-type semiconductor properties. When the 2D semiconductor layer S10 is the p-type semiconductor, the 2D semiconductor layer S10 may include at least one of $WS_2$, $ZrS_2$, $ZrSe_2$, $HfS_2$, $HfSe_2$, and $NbSe_2$, as the metal chalcogenide-based material having p-type semiconductor properties. However, a material of the 2D semiconductor layer S10 is not limited to the above-described materials, and may be variously changed.

The type of the transistor TR10 may be changed depending on the 2D semiconductor layer S10. When the 2D semiconductor layer S10 is an n-type semiconductor, the transistor TR10 may be an n-type transistor, and when the 2D semiconductor layer S10 is a p-type semiconductor, the transistor TR10 may be a p-type transistor. The transistor TR10 may be a unipolar three-terminal vertical transistor.

The capacitor CP10 may include the third electrode E30 and a fourth electrode E40, and may include a second insulation layer N20 between the third and fourth electrodes E30 and E40. The second insulation layer N20 may be a capacitor dielectric. The third electrode E30 may be used as the drain electrode (or the source electrode) of the transistor TR10, and may be used as a lower electrode of the capacitor CP10. That is, the third electrode E30 may be an electrode shared by the transistor TR10 and the capacitor CP10. The fourth electrode E40 may be an upper electrode. At least one of the third and fourth electrodes E30 and E40 may include graphene. For example, all the third and fourth electrodes E30 and E40 may be formed of graphene. However, as needed, at least one of the third and fourth electrodes E30 and E40 may include a different conductive material than graphene, for example, a metal or metal compound. The second insulation layer N20 may be formed of an insulating 2D material such as h-BN. However, as needed, the second insulation layer N20 may be formed of another material (a dielectric material) which is not a 2D material. All dielectric materials for a capacitor may be applied as a material of the second insulation layer N20.

The first electrode E10, the first insulation layer N10, and the second electrode E20 may have a first width, and the 2D semiconductor layer S10, the third electrode E30, the second insulation layer N20, and the fourth electrode E40 may have a second width smaller than the first width, as illustrated in FIG. 1. Thus, a portion of the second electrode E20 may be exposed without being covered by the 2D semiconductor layer S10, the third electrode E30, the second insulation layer N20, and the fourth electrode E40. However, such a structure is an example, and may be variously changed.

An electrical barrier between the second electrode (i.e., a graphene layer) E20 and the 2D semiconductor layer S10 may be adjusted, and the turn-on/off of the transistor TR10 may be controlled, according to a voltage applied to the first electrode E10. When a thickness of the 2D semiconductor layer S10 is thin (for example, about 5 nm or less), the transistor TR10 may be a tunneling barrier device, and when the thickness of the 2D semiconductor layer S10 is relatively thick (for example, about several nm), the transistor TR10 may be a Schottky barrier device. When the transistor TR10 is turned on, electrons may flow from the second electrode E20 to the third electrode E30, and may be accumulated (trapped) in the third electrode E30. As a result, an electric charge may be charged into the second insulation layer N20. That is, an electric charge may be charged into the capacitor CP10. In this case, it may be considered that a certain data, for example, data corresponding to 1, is written in the memory device. If the electric charge charged into the second insulation layer N20 is discharged, it may be considered that another data, for example, data corresponding to 0, is written in the memory device. The operation principle of the memory device will be described below in more detail.

All elements (i.e., the first to fourth electrodes E10, E20, E30 and E40, the first and second insulation layers N10 and N20, and the 2D semiconductor layer S10) of the device (the memory device) of FIG. 1 may be formed of a 2D material. In this case, the device of FIG. 1 may be a 2D memory device. Therefore, the device of FIG. 1 may have a low thickness (for example, a thickness of about 10 nm or less), and have a flexible characteristic and a transparent characteristic. That is, the device of FIG. 1 may be an ultra-thin flexible device or an ultra-thin transparent device. However, as needed, at least one of the first electrode E10, the first insulation layer N10, the third electrode E30, the second insulation layer N20 and the fourth electrode E40 may not be formed of a 2D material. Although at least one of the elements E10, N10, E30, N20 and E40 is not formed of a 2D material, a flexible and/or transparent device may be implemented by using a flexible material and/or a transparent material. Also, since the device of FIG. 1 has a simple stacked structure including a 2D material, it may be easy to manufacture the memory device, and it may be suitable to apply the memory device to a large-area (large-scale) process.

Figure 2:
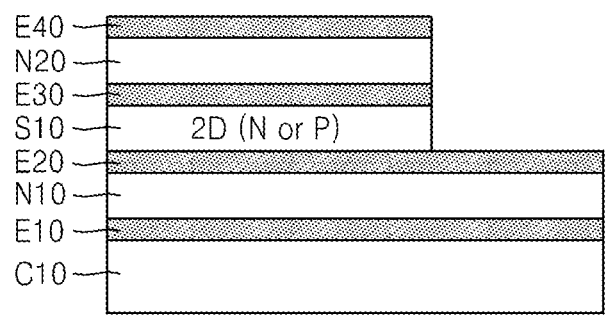
FIG. 2 is a cross-sectional view illustrating a memory device according to at least one example embodiment.

According to another example embodiment, a conductive layer and/or a substrate may be further provided under the first electrode E10 of FIG. 1. An example thereof is illustrated in FIG. 2. FIG. 2 is a cross-sectional view illustrating a memory device according to another example embodiment.

Referring to FIG. 2, a conductive layer C10 may be further provided under the first electrode E10. The conductive layer C10 may be a conductive substrate. The conductive layer C10 may be formed of, for example, at least one metal such as copper (Cu), nickel (Ni), iron (Fe), cobalt (Co), platinum (Pt), or ruthenium (Ru). The at least one metal may be a catalyst material for forming graphene. Thus, the conductive layer C10 may be a catalyst layer. The first electrode E10 formed of graphene may be formed on the conductive layer C10. Although not shown, a substrate may be further provided under the conductive layer C10. The substrate may be one of various substrates that are used in a semiconductor device process. For example, the substrate may be a semiconductor substrate such as a silicon substrate, or another substrate, for example, a sapphire substrate, a SiC substrate, or a quartz substrate. The structure of FIG. 1 may be obtained by removing the conductive layer C10 from the structure of FIG. 2.

Figure 3:
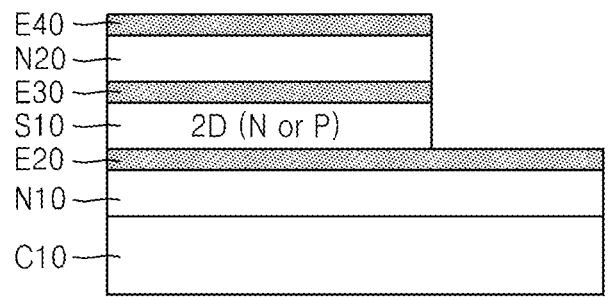
FIG. 3 is a cross-sectional view illustrating a memory device according to at least one example embodiment.

According to another example embodiment, in the structure of FIG. 2, the first insulation layer N10 may be formed on the conductive layer C10 without the first electrode E10. An example thereof is illustrated in FIG. 3. FIG. 3 is a cross-sectional view illustrating a memory device according to another example embodiment.

Referring to FIG. 3, the first insulation layers N10 and the second electrode E20 may be sequentially provided on the conductive layer C10. The 2D semiconductor layer S10, the third electrode E30, the second insulation layer N20, and the fourth electrode E40 may be sequentially provided on the second electrode E20. The structure of FIG. 3 may be a structure that is obtained by removing the first electrode E10 from the structure of FIG. 2. In this case, the conductive layer C10 may act as the first electrode. That is, the conductor layer C10 may be the first electrode.

In the device structures of FIGS. 2 and 3, by using a flexible material as a material of the conductive layer C10, the devices of FIGS. 2 and 3 may have a flexible characteristic. Also, by using a transparent material as a material of the conductive layer C10, the devices of FIGS. 2 and 3 may have a transparent characteristic.

Hereinafter, a method of operating the memory device of FIG. 1 will be described in detail with reference to FIGS. 4 to 7, according to at least one example embodiment.

Figure 4:
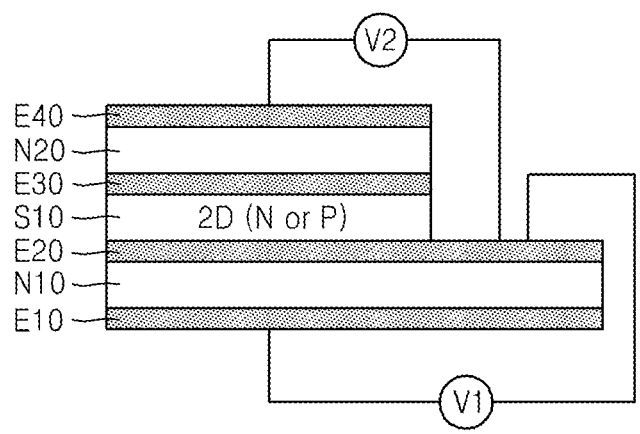
FIG. 4 is a cross-sectional view describing a voltage applied between electrodes when the example memory device of FIG. 1 operates.

FIG. 4 is a cross-sectional view for describing voltages V1 and V2 applied between electrodes when the memory device of FIG. 1 operates, according to at least one example embodiment.

Referring to FIG. 4, a first voltage V1 may be applied between the first and second electrodes E10 and E20, and a second voltage V2 may be applied between the second and fourth electrodes E20 and E40. An operation of writing data in the memory device and an operation of erasing data from the memory device may be performed by controlling a polarity (sign) and an intensity of each of the first and second voltages V1 and V2.

Figure 5:
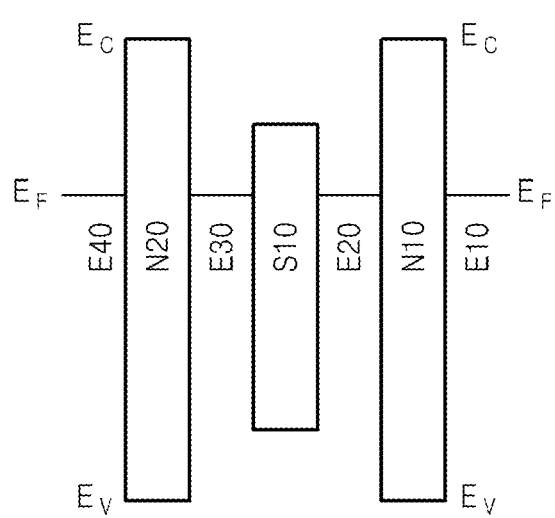
FIG. 5 is an energy band diagram in an equilibrium state of the example memory device of FIG. 4.

FIG. 5 is an energy band diagram in an equilibrium state of the example memory device of FIG. 4. The equilibrium state may be a state in which no voltage is applied to the first to fourth electrodes E10, E20, E30 and E40. In the equilibrium state, as illustrated in FIG. 5, Fermi energy levels $E_F$ of the first to fourth electrodes E10, E20, E30 and E40 match each other. In FIG. 5, reference mark $E_V$ refers to a valence band maximum energy level, and reference mark $E_C$ refers to a conduction band minimum energy level. In FIGS. 6, 7 and 11 to 13, like reference marks refer to like elements.

Figure 6:
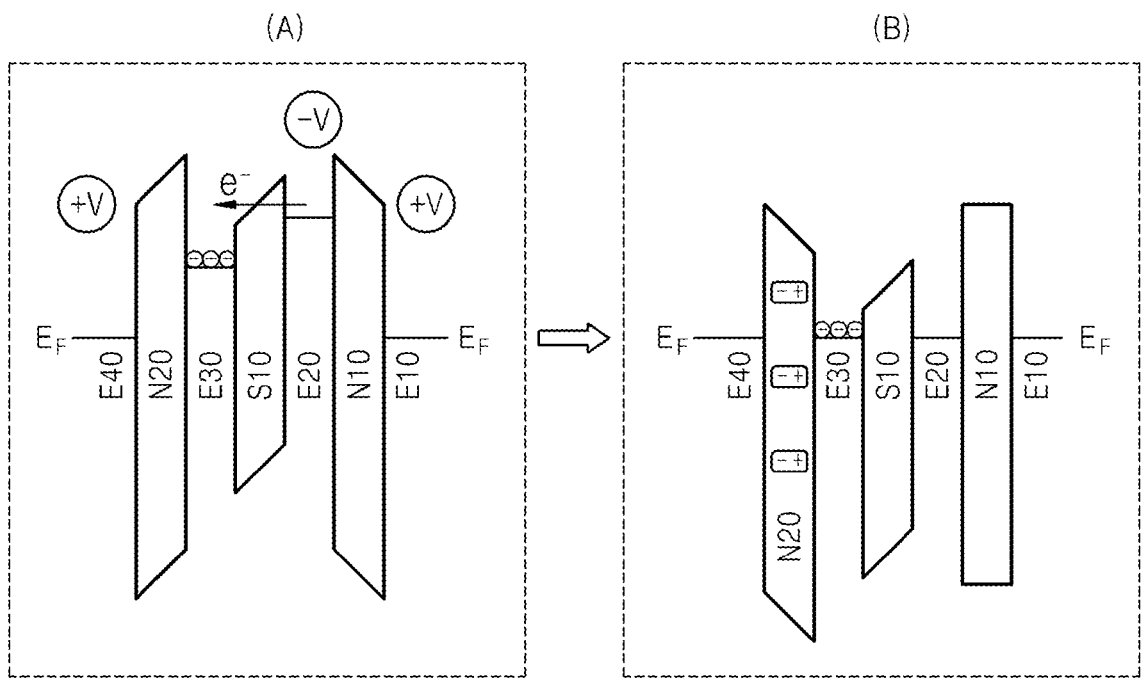
FIG. 6 illustrates energy band diagrams for describing a method of writing data in the memory device of FIG. 4, according to at least one example embodiment.

FIG. 6 is energy band diagrams for describing a method of writing data in the memory device of FIG. 4, according to at least one example embodiment.

Referring to drawing (A) of FIG. 6, a positive (+) voltage is applied to the first electrode E10, a negative (−) voltage is applied to the second electrode E20, and a positive (+) voltage is applied to the fourth electrode E40. In this case, a voltage applied between the first electrode E10 and the second electrode E20 may correspond to the first voltage V1 of FIG. 4, and a voltage applied between the second electrode E20 and the fourth electrode E40 may correspond to the second voltage V2 of FIG. 4. Due to the application of the voltages, a barrier between the second electrode E20 and the third electrode E30 may be lowered, and thus, electrons may move from the second electrode E20 to the third electrode E30. At this time, tunneling of electrons through the 2D semiconductor layer 510 may occur. The tunneling of electrons may be direct tunneling or F-N tunneling (Fowler-Nordheim tunneling). Since the third electrode E30 is floated, electrons may be accumulated (trapped) in the third electrode E30. At this time, since a positive (+) voltage has been applied to the fourth electrode E40, electric charge may be charged into the second insulation layer N20. A result thereof is illustrated in drawing (B) of FIG. 6. As illustrated in drawing (B) of FIG. 6, a state in which an electric charge is charged in the second insulation layer N20 may be considered as data '1' being stored in the memory device. If necessary, in order to maintain the electric charge-charged state of the second insulation layer N20, a refresh process that additionally performs an operation of applying a voltage as in drawing (A) of FIG. 6 may be further performed. However, when the second insulation layer N20 is nonvolatile, the refresh process may not be required or performed.

Figure 7:
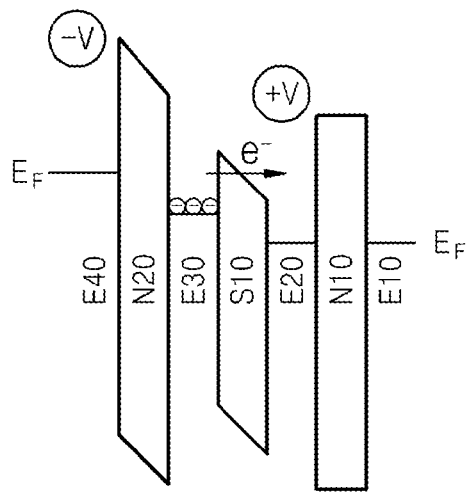
FIG. 7 is an energy band diagram for describing a method of erasing data from the memory device of FIG. 4, according to at least one example embodiment.

FIG. 7 is an energy band diagram for describing an example method of erasing data from the memory device of FIG. 4. The method of FIG. 7 may be a data erasing method with respect to the (B) structure of FIG. 6.

Referring to FIG. 7, a positive (+) voltage may be applied to the second electrode E20, and a negative (−) voltage may be applied to the fourth electrode E40. No voltage may be applied to the first electrode E10. A voltage applied between the second electrode E20 and the fourth electrode E40 may have a polarity (sign) opposite to the polarity illustrated in FIG. 6. That is, the voltage applied between the second electrode E20 and the fourth electrode E40 may be a reverse voltage of the second voltage V2 which is used in a writing operation. In this case, electrons of the third electrode E30 flow through the second electrode E20, and electric charges charged in the second insulation layer N20 may be discharged. Therefore, it may be considered that the data '1' is erased. Also, a state in which an electric charge of the second insulation layer N20 is discharged may correspond to data '0'.

The example methods of operating the memory device, which have been described above with reference to FIGS. 4 to 7, are just examples, and may be variously changed. As an example, a predetermined or given voltage may be applied between the first electrode E10 and the second electrode E20 in the data erasing operation of FIG. 7.

Figure 8:
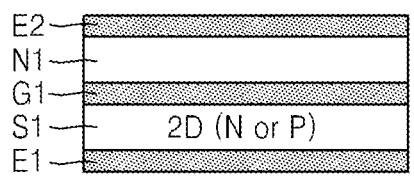
FIG. 8 is a cross-sectional view illustrating a memory device according to at least one example embodiment.

FIG. 8 is a cross-sectional view illustrating a memory device according to another example embodiment.

Referring to FIG. 8, the memory device according to at least one example embodiment may include a first electrode E1 and a second electrode E2. Also, the memory device may include a 2D semiconductor layer S1, a graphene layer G1, and a capacitor dielectric layer N1 which are provided between the first electrode E1 and the second electrode E2. The 2D semiconductor layer S1 may be provided between the graphene layer G1 and the first electrode E1, and the dielectric layer N1 may be provided between the graphene layer G1 and the second electrode E2. The 2D semiconductor layer S1 and the dielectric layer N1 may be switched in position. The dielectric layer N1 may be an insulation layer having a dielectric characteristic. The memory device according to the example embodiment may be a device that stores data by charging the dielectric layer N1 with an electric charge.

At least one of the first and second electrodes E1 and E2 may include graphene. For example, all of the first and second electrodes E1 and E2 may be formed of a graphene layer. However, as needed, at least one of the first and second electrodes E1 and E2 may include a different conductive material than graphene, for example, a metal or metal compound. The 2D semiconductor layer S1 may be formed of a material which is the same as or similar to the material of the 2D semiconductor layer S10 of FIG. 1. Thus, the 2D semiconductor layer S1 may be n-type semiconductor or p-type semiconductor which contains a metal chalcogenide-based material. An n-type metal chalcogenide-based material may be, for example, $MoS_2$, $MoSe_2$, $MoTe_2$, $WSe_2$, or $WTe_2$, and a p-type metal chalcogenide-based material may be, for example, $WS_2$, $ZrS_2$, $ZrSe_2$, $HfS_2$, $HfSe_2$, $NbSe_2$. However, a material of the 2D semiconductor layer S1 is not limited thereto, and may be variously changed. A material of the dielectric layer N1 may be the same as or similar to the material of the second insulation layer N20 of FIG. 1. For example, the dielectric layer N1 may be formed of an insulating 2D material such as h-BN. However, as needed, the dielectric layer N1 may be formed of a material (a dielectric material) which is not a 2D material. All dielectric materials for a capacitor may be applied as a material of the dielectric layer N1.

The device of FIG. 8 may be a two-terminal vertical device that uses the two electrodes E1 and E2 as terminals. The graphene layer G1 may be floated. Also, when a thickness of the 2D semiconductor layer S1 is thin, the device of FIG. 8 may be a tunneling barrier device, and when the thickness of the 2D semiconductor layer S1 is relatively thick, the device of FIG. 8 may constitute a Schottky barrier device.

All elements (i.e., the first electrode E1, the 2D semiconductor layer S1, the graphene layer G1, the dielectric layer N1, and the second electrode E2) of the device of FIG. 8 may be formed of a 2D material. In this case, the device of FIG. 8 may be a 2D memory device. Therefore, the device of FIG. 8 may have a low thickness (for example, a thickness of about 10 nm or less), and may be flexible and transparent. However, as needed, at least one of the first electrode E1, the dielectric layer N1, and the second electrode E2 may not be formed of a 2D material. Although at least one of the first electrode E1, the dielectric layer N1, and the second electrode E2 is not formed of a 2D material, a flexible and/or transparent device may be implemented by using a flexible material and/or a transparent material. Also, since the device of FIG. 8 has a simpler structure than a structure of the device of FIG. 1, the device of FIG. 8 may be easier to manufacture. Also, the device of FIG. 8 may be easily applied to a memory array.

Figure 9:
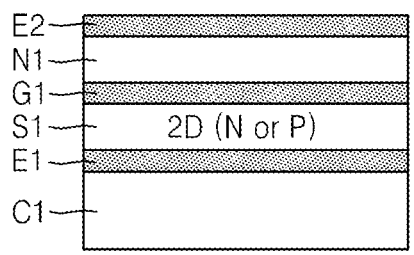
FIG. 9 is a cross-sectional view illustrating a memory device according to at least one example embodiment.

According to another example embodiment, a conductive layer and/or a substrate may be further provided under the first electrode E1 of FIG. 8. An example thereof is illustrated in FIG. 9. FIG. 9 is a cross-sectional view illustrating a memory device according to another example embodiment.

Referring to FIG. 9, a conductive layer C1 may be further provided under the first electrode E1. The conductive layer C1 may be a conductive substrate. The conductive layer C1 may be formed of, for example, metal such as copper (Cu), nickel (Ni), iron (Fe), cobalt (Co), platinum (Pt), or ruthenium (Ru). Such materials (metal) may be a catalyst material used to form graphene. Therefore, the conductive layer C1 may be a catalyst layer. Although not shown, a substrate may be further provided under the conductive layer C1. The substrate may be one of various substrates that are typically used in a semiconductor device. In the structure of FIG. 9, by using a flexible material and/or a transparent material as a material of the conductive layer C1, the device of FIG. 9 may have a flexible characteristic and/or a transparent characteristic. The structure of FIG. 8 may be obtained by removing the conductive layer C1 from the structure of FIG. 9.

Although not shown, according to another example embodiment, a structure in which the first electrode E1 is removed from the structure of FIG. 9 may be implemented. That is, in FIG. 9, a structure in which the conductive layer C1 directly contacts the 2D semiconductor layer S1 without the first electrode E1 may be implemented. In this case, the conductive layer C1 may be used as a first electrode.

Hereinafter, a method of operating the example memory device of FIG. 8 will be described in detail with reference to FIGS. 10 to 13.

Figure 10:
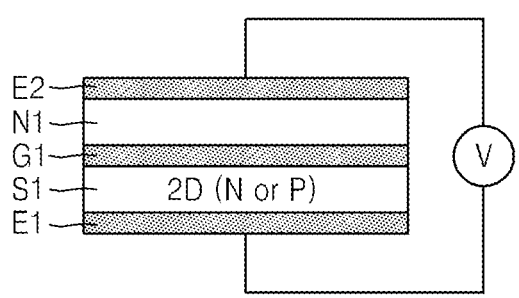
FIG. 10 is a cross-sectional view for describing a voltage applied between electrodes when the example memory device of FIG. 8 operates.

FIG. 10 is a cross-sectional view for describing a voltage V applied between electrodes when the example memory device of FIG. 8 operates.

Referring to FIG. 10, the voltage V may be applied between the first and second electrodes E1 and E2. An operation of writing data in the memory device and an operation of erasing data from the memory device may be performed by controlling a polarity (sign) and an intensity of the voltage V.

Figure 11:
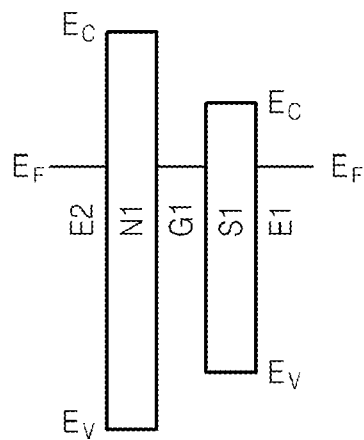
FIG. 11 is an energy band diagram in an equilibrium state of the example memory device of FIG. 10.

FIG. 11 is an energy band diagram in an equilibrium state of the example memory device of FIG. 10. The equilibrium state may be a state in which a voltage is not applied to the first and second electrodes E1 and E2. In the equilibrium state, as illustrated in FIG. 11, Fermi energy levels $E_F$ of the first and second electrodes E1 and E2 match each other.

Figure 12:
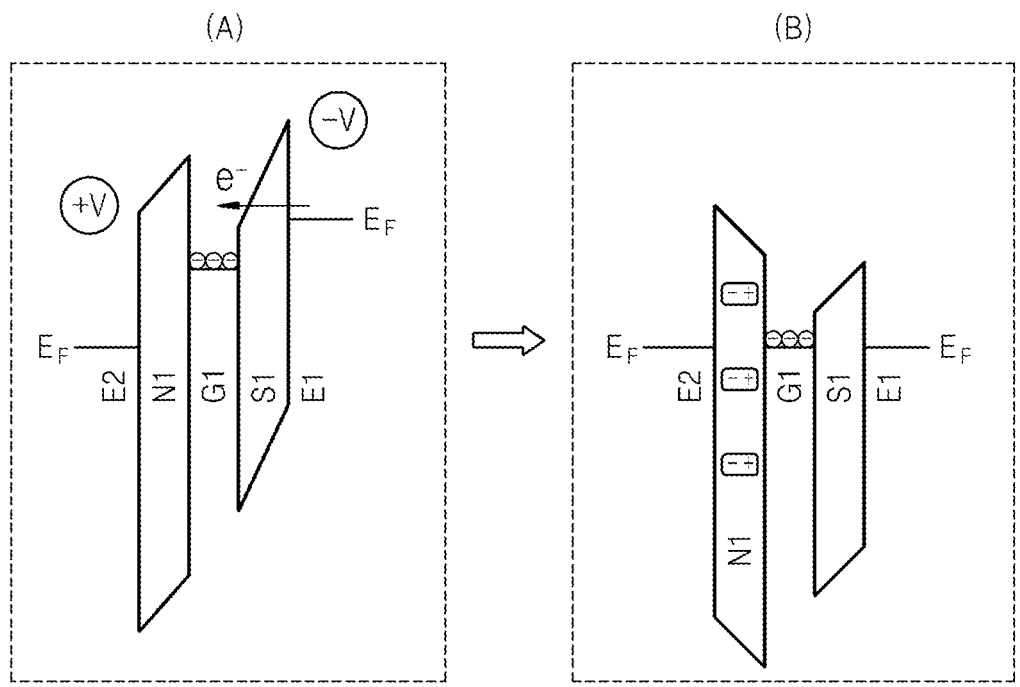
FIG. 12 is energy band diagrams for describing a method of writing data in the example memory device of FIG. 10.

FIG. 12 is energy band diagrams for describing a method of writing data in the memory device of FIG. 10, according to at least one example embodiment.

Referring to drawing (A) of FIG. 12, a negative (−) voltage may be applied to the first electrode E1, and a positive (+) voltage may be applied to the second electrode E2. Due to the application of the voltages, electrons may move from the first electrode E1 to the graphene layer G1. At this time, tunneling of electrons through the 2D semiconductor layer S1 may occur. The tunneling of electrons may be direct tunneling or F-N tunneling (Fowler-Nordheim tunneling). Since the graphene layer G1 is floated, electrons may be accumulated (trapped) in the graphene layer G1. At this time, since a positive (+) voltage has been applied to the second electrode E2, an electric charge may be charged into the dielectric layer N1. A result of the electric charge being charged into the dielectric layer N1 is illustrated in drawing (B) of FIG. 12. As illustrated in drawing (B) of FIG. 12, a state in which an electric charge is charged into the dielectric layer N1 may be considered as data '1' being stored in the memory device. If necessary, in order to maintain the electric charge-charged state of the dielectric layer N1, a refresh process that additionally performs an operation of applying a voltage as in drawing (A) of FIG. 12 may be further performed. However, when the dielectric layer N1 is nonvolatile, the refresh process may not be required.

Figure 13:
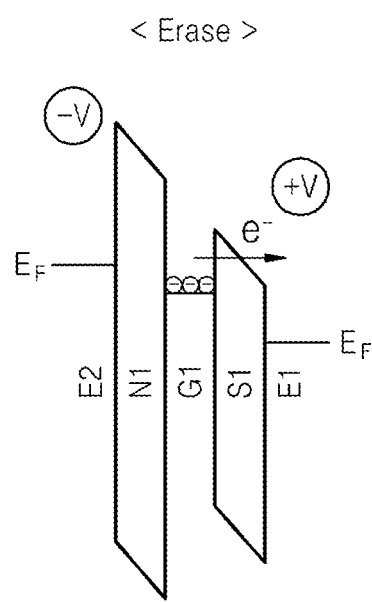
FIG. 13 is an energy band diagram for describing a method of erasing data from the memory device of FIG. 10.

FIG. 13 is an energy band diagram for describing a method of erasing data from the memory device of FIG. 10, according to at least one example embodiment. The method of FIG. 13 may be a data erasing method with respect to the (B) structure of FIG. 12.

Referring to FIG. 13, a positive (+) voltage may be applied to the first electrode E1, and a negative (−) voltage may be applied to the second electrode E2. A voltage applied between the first electrode E1 and the second electrode E2 may have a polarity (sign) opposite to the polarity of FIG. 12. That is, the voltage applied between the first electrode E1 and the second electrode E2 may be a reverse voltage of a voltage used in a writing operation. In this case, electrons of the graphene layer G1 may flow out through the first electrode E1, and electric charges charged into the dielectric layer N1 may be discharged. Thus, it may be considered that the data '1' is erased. Also, a state in which an electric charge of the dielectric layer N1 is discharged may correspond to data '0'.

Figure 14:
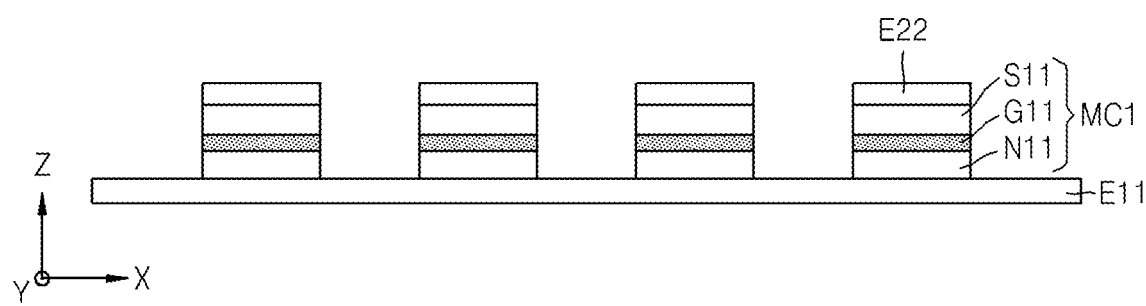
FIG. 14 is a cross-sectional view illustrating a memory array according to at least one example embodiment.

The structure of each of FIGS. 8 and 9, or a structure modified therefrom, may correspond to one memory cell, and a plurality of the memory cells may configure a memory array. That is, the structure of each of FIGS. 8 and 9, or a structure modified therefrom, may be applied as a unit structure of the memory array. An example thereof is illustrated in FIG. 14. FIG. 14 is a cross-sectional view illustrating a memory array according to an example embodiment.

Referring to FIG. 14, the memory array according to an example embodiment may include a first electrode line E11 that extends in a certain direction, for example, an X-axis direction. Only one first electrode line E11 is illustrated, but a plurality of first electrode lines E11 may be provided. The plurality of first electrode lines E11 may be arranged to be separated from each other in a Y-axis direction. The memory array may include a second electrode line E22 separated from the first electrode line E11. The second electrode line E22 may extend in a direction intersecting the first electrode line E11, for example, the Y-axis direction. A plurality of second electrode lines E22 may be provided, and the plurality of second electrode lines E22 may be arranged to be separated from each other in the X-axis direction. A memory cell MC1 may be provided at each one of the cross points between the first electrode lines E11 and the second electrode lines E22. The memory cell MC1 may include a capacitor dielectric layer N11, a graphene layer G11, and a 2D semiconductor layer S11. The dielectric layer N11, the graphene layer G11, and the 2D semiconductor layer S11 may be sequentially stacked on the first electrode line E11. Thus, the dielectric layer N11 may be disposed between the first electrode line E11 and the graphene layer G11, and the 2D semiconductor layer S11 may be disposed between the second electrode line E22 and the graphene layer G11. The dielectric layer N11 and the 2D semiconductor layer S11 may be switched in position. The dielectric layer N11, the graphene layer G11, and the 2D semiconductor layer S11 may respectively correspond to the dielectric layer N1, graphene layer G1, and 2D semiconductor layer S1 of FIG. 8. Also, a material of each of the first electrode line E11 and the second electrode line E22 may be a material that is equal to, the same as, or similar to the material of each of the first electrode E1 and the second electrode E2 of FIG. 8. Although not shown, a space between the memory cells MC1 may be filled with an insulating material.

Figure 15:
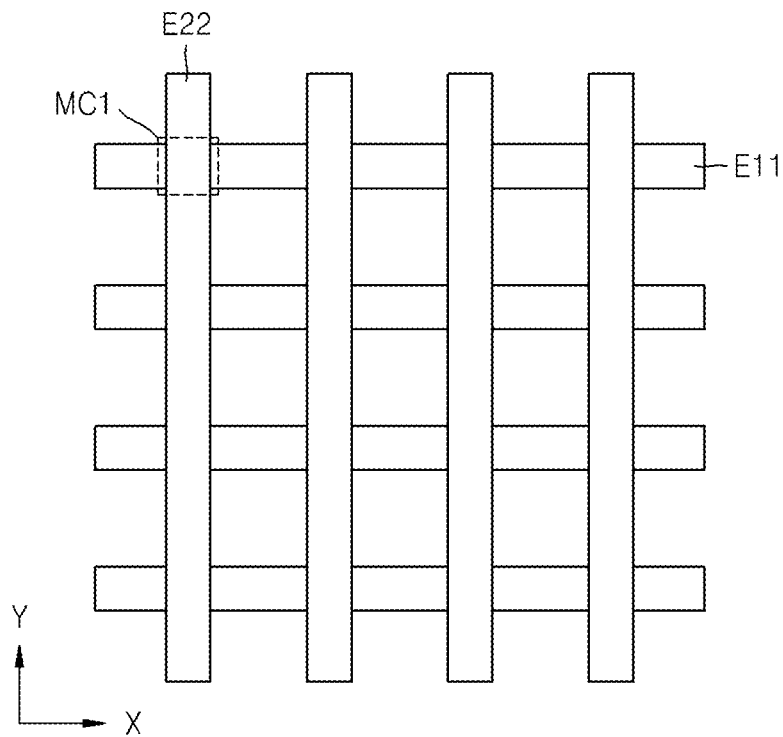
FIG. 15 is a plan view illustrating a plan structure of the example memory array of FIG. 14 as seen from above.

FIG. 15 is a plan view illustrating a plan structure of the example memory array of FIG. 14 as seen from above. Referring to FIG. 15, the plurality of first electrode lines E11 may be arranged to be separated from each other, and the plurality of second electrode lines E22 crossing the plurality of first electrode lines E11 may be arranged to be separated from each other. The one or more memory cell MC1 may be provided at each one of the cross points between the first electrode lines E11 and the second electrode lines E22. The one or more memory cell MC1 may have the structure described with reference to FIG. 14.

The memory array of FIGS. 14 and 15 may be referred to as a cross-point memory array. Also, the memory array of FIGS. 14 and 15 may be referred to as a 2D cross-point memory array. The memory array uses 2D materials and has a simple structure, and thus has a high performance, a high density, and the like. In addition, it may be easy to manufacture the memory array, and the memory array may have a transparent characteristic and a flexible characteristic.

Figure 16:
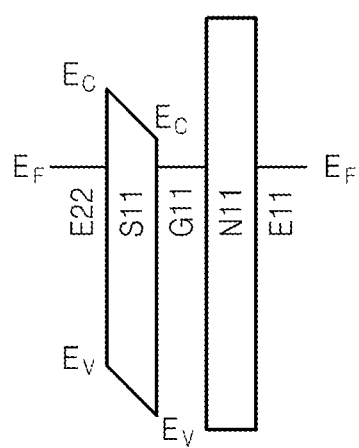
FIG. 16 is an energy band diagram of a memory cell in an equilibrium state of the example memory array of FIG. 10.

FIG. 16 is an energy band diagram of the memory cell MC1 in an equilibrium state of the memory array of FIG. 10, according to at least one example embodiment.

Referring to FIG. 16, in the equilibrium state, an energy band of the 2D semiconductor layer S11 may have an asymmetric barrier structure. In more detail, in the equilibrium state, $E_C$ of the 2D semiconductor layer S11 toward the second electrode line E22 may be higher than $E_C$ of the 2D semiconductor layer S11 toward the graphene layer G11. Also, in the equilibrium state, $E_V$ of the 2D semiconductor layer S11 toward the second electrode line E22 may be higher than $E_V$ of the 2D semiconductor layer S11 toward the graphene layer G11. As described above, when the energy band of the 2D semiconductor layer S11 may have the asymmetric barrier structure in the equilibrium state, the 2D semiconductor layer S11 may act as a switching element such as a diode. In this case, in the cross-point memory array, a selective operation for a certain memory cell is easily performed. In order for the energy band of the 2D semiconductor layer S11 to have the asymmetric barrier structure, a material having a high work function (for example, a material having a work function greater than about 4.5 eV) may be applied as a material of the second electrode line E22. For example, when a material having a work function greater than a work function of the graphene layer G11 is applied as the material of the second electrode line E22, the energy band of the 2D semiconductor layer S11 may have an asymmetric structure as illustrated in FIG. 16. The second electrode line E22 may be formed of graphene (for example, doped graphene) having a work function greater than a work function of the graphene layer G11, or may be formed of metal or a metal compound which has a work function greater than a work function of the graphene layer G11. Except for the energy band of the 2D semiconductor layer S11, energy band structures of the other layers may be the same as or similar to those of FIG. 11, and thus, their detailed descriptions are not repeated.

FIGS. 17A to 17D are cross-sectional views illustrating a method of manufacturing a memory device according to an example embodiment.

Figure 17A:
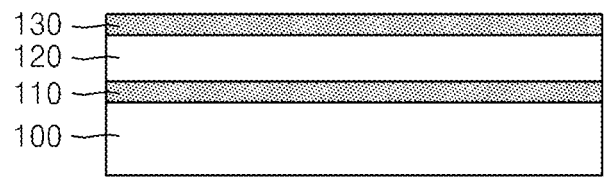
FIGS. 17A to 17D are cross-sectional views illustrating a method of manufacturing a memory device, according to at least one example embodiment.

Referring to FIG. 17A, a first electrode 110 may be formed on a conductor 100. The first electrode 110 may be formed of, for example, graphene. In this case, the conductor 100 may include catalyst metal for growing graphene. The catalyst metal may include, for example, Cu, Ni, Fe, Co, Pt, and Ru. A graphene layer may be formed on the catalyst metal by a chemical vapor deposition (CVD) method or a pyrolysis method, and may be used as the first electrode 110. However, a material of the first electrode 110 is not limited to graphene, and may be variously changed. Also, a material of the conductor 100 may also be changed. Although not shown, a substrate may be further provided under the conductor 100.

Next, a first insulation layer 120 and a second electrode 130 may be sequentially formed on the first electrode 110. The first insulation layer 120 may be formed of, for example, an insulating 2D material such as h-BN. The second electrode 130 may be formed of graphene. Here, h-BN may be easily grown on the graphene layer (i.e., the first electrode 110), and another graphene layer (i.e., the second electrode 130) may be easily grown on h-BN. However, a material of the first insulation layer 120 is not limited to h-BN.

Figure 17B:
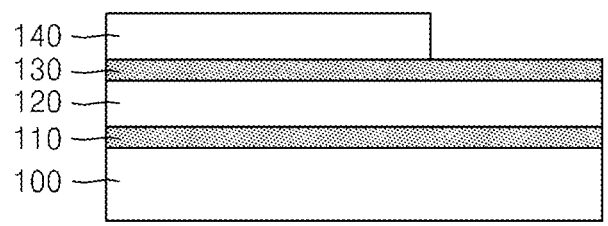

Referring to FIG. 17B, a 2D semiconductor layer 140 may be formed on the second electrode 130. The 2D semiconductor layer 140 may include, for example, a metal chalcogenide-based material. The 2D semiconductor layer 140 may be an n-type semiconductor or a p-type semiconductor. When the 2D semiconductor layer 140 is the n-type semiconductor, the 2D semiconductor layer 140 may include at least one of $MoS_2$, $MoSe_2$, MoTe2, $WSe_2$, and $WTe_2$ as a metal chalcogenide-based material having an n-type semiconductor characteristic. When the 2D semiconductor layer 140 is the p-type semiconductor, the 2D semiconductor layer 140 may include at least one of $WS_2$, $ZrS_2$, $ZrSe_2$, $HfS_2$, $HfSe_2$, and $NbSe_2$ as a metal chalcogenide-based material having a p-type semiconductor characteristic. However, a detailed material of the 2D semiconductor material 140 is not limited to the above-described materials, and may be variously changed. An example method of forming the 2D semiconductor layer 140 will now be described in detail.

According to a first example method, a precursor solution including a precursor of a metal chalcogenide-based material is prepared, and then, the precursor solution is provided (coated) onto the second electrode 130 to form a thin film. By annealing (thermal treatment) the thin film, the 2D semiconductor layer 140 may be formed. The precursor may be a precursor of one of $MoS_2$, $MoSe_2$, MoTe2, $WSe_2$, and $WTe_2$ which have an n-type semiconductor characteristic, or may be a precursor of one of $WS_2$, $ZrS_2$, $ZrSe_2$, $HfS_2$, $HfSe_2$, and $NbSe_2$ which have a p-type semiconductor characteristic. As an example, $(NH_4)_2MoS_4$ may be used as a precursor of $MoS_2$, and $(NH_4)_2WS_4$ may be used as a precursor of $WS_2$. The precursor solution may be prepared by mixing the precursor with a solution (an organic solution). An annealing process for the thin film formed of the precursor solution may be performed, for example, within a temperature range of about 300° C. to about 2,000° C. A metal chalcogenide-based material may be formed from the precursor by the annealing process. For example, when the precursor is $(NH_4)_2MoS_4$, $(NH_4)_2$ may be removed (vaporized) from $(NH_4)_2MoS_4$, and $MoS_4$ may be changed to $MoS_2$. When the precursor is $(NH_4)_2WS_4$, $(NH_4)_2$ may be removed (vaporized) from $(NH_4)_2WS_4$, and $WS_4$ may be changed to $WS_2$. In the annealing process for the thin film, a chalcogen-based material may be injected into a chamber including the thin film. Here, the chalcogen-based material may include, for example, one of S, Se, and Te. When the precursor is $(NH_4)_2MoS_4$ or $(NH_4)_2WS_4$, the chalcogen-based material may include sulfur (S). When the chalcogen-based material is injected in the annealing process, a 2D material layer (i.e., the 2D semiconductor layer) 140 may be more easily formed. Also, an additional annealing (thermal treatment) process may be further performed. The additional annealing process may be performed at a temperature of about 300° C. to about 2,000° C.

According to a second example method, a thin film including metal oxide may be formed on the second electrode 130, and then, by changing the metal oxide of the thin film to a metal chalcogenide-based material, the 2D semiconductor layer 140 may be formed. The metal oxide may include an oxide of one of Mo, W, Nb, V, Ta, Ti, Zr, Hf, Tc, Re, Cu, Ga, In, Sn, Ge, and Pb. For example, the metal oxide may include $MoO_3$ or $WO_3$. The operation, which changes the metal oxide of the thin film to the metal chalcogenide-based material, may include a process that anneals the thin film while injecting a chalcogenide-based material into a reaction chamber (an annealing chamber) including the thin film. For example, when the metal oxide may include $MoO_3$ (or $WO_3$) and a metal chalcogenide-based material to form is $MoS_2$ (or $WS_2$), the chalcogenide-based material may include sulfur (S). That is, $MoO_3$ (or $WO_3$) may be changed to $MoS_2$ (or $WS_2$) by performing the annealing process for the thin film while supplying sulfur (S) into the reaction chamber (the annealing chamber). The kind of a 2D material (a metal chalcogenide-based material) may be changed depending on the kind of metal oxide and the kind of used chalcogenide-based material. The annealing process may be performed, for example, within a temperature range of about 300° C. to about 2,000° C. Subsequently, an additional annealing process may be further performed. The additional annealing process may also be performed at a temperature of about 300° C. to about 2,000° C.

The above-described method of forming the 2D semiconductor layer 140 is an example, and may be variously changed. For example, the 2D semiconductor layer 140 may be formed by various methods disclosed in Korean Patent Application No. 10-2013-0133830.

Figure 17C:
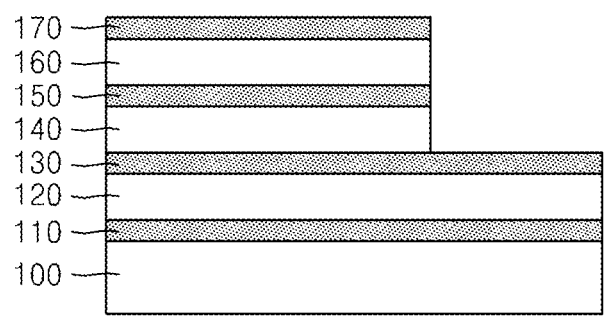

Referring to FIG. 17C, a third electrode 150, a second insulation layer 160, and a fourth electrode 170 may be sequentially formed on the 2D semiconductor layer 140. Materials of the third electrode 150, the second insulation layer 160, and the fourth electrode 170 may respectively correspond to, be the same as or similar to the materials of the third electrode E30, second insulation N20, and fourth electrode E40 of FIG. 1. Therefore, at least one of the third and fourth electrodes 150 and 170 may be formed of graphene, or may be formed of another material (for example, metal or a metal compound) instead of graphene. The second insulation layer 160 may be formed of an insulating 2D material such as h-BN, or may be formed another material (a dielectric material) instead of a 2D material. All dielectric materials for a capacitor may be applied as a material of the second insulation layer 160.

Although not shown, a top surface of the second electrode 130 that is not covered by the 2D semiconductor layer 140 may be covered by a predetermined or given material layer (an insulation layer), and then, the third electrode 150, the second insulation layer 160, and the fourth electrode 170 may be selectively formed on the 2D semiconductor layer 140. Thereafter, the material layer (the insulation layer) may be removed.

Moreover, the third electrode 150, the second insulation layer 160, and the fourth electrode 170 may be formed by a transfer method instead of a growth method. That is, a stacked structure that includes the third electrode 150, the second insulation layer 160, and the fourth electrode 170 may be formed on another substrate (not shown), and then, the stacked structure may be transferred onto the 2D semiconductor layer 140. In addition, the example method of forming the structure of FIG. 17C may be variously changed.

Figure 17D:
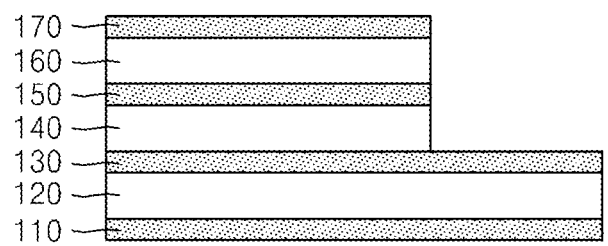

Subsequently, as needed, the conductor 100 may be removed from the structure of FIG. 17C. The conductor 100 may be removed by an etching process. A result, which is obtained by removing the conductor 100 from the structure of FIG. 17C, is illustrated in FIG. 17D. In a structure of FIG. 17D, the first electrode 110, the first insulation layer 120, the second electrode 130, the 2D semiconductor layer 140, the third electrode 150, the second insulation layer 160, and the fourth electrode 170 may respectively correspond to the first electrode E10, the first insulation layer N10, the second electrode E20, the 2D semiconductor layer S10, the third electrode E30, the second insulation N20, and the fourth electrode E40 of FIG. 1. All of the first electrode 110, the first insulation layer 120, the second electrode 130, the 2D semiconductor layer 140, the third electrode 150, the second insulation layer 160, and the fourth electrode 170, may be formed of a 2D material. Therefore, the device of FIG. 17D may have a low thickness (for example, a thickness of about 10 nm or less), and have a flexible characteristic and a transparent characteristic. That is, the device of FIG. 17D may be an ultra-thin flexible device or an ultra-thin transparent device. However, at least one of the first electrode 110, the first insulation layer 120, the third electrode 150, the second insulation layer 160, and the fourth electrode 170 may not be formed of a 2D material.

The manufacturing method of FIGS. 17A to 17D may be variously changed. For example, in the process of FIG. 17A, the first electrode 110 may not be formed, and the first insulation layer 120 may be formed on the conductor 100. Then, by performing a subsequent process, a memory device having the structure of FIG. 3 may be obtained. Also, the process of FIG. 17D, namely, a process of removing the conductor 100, may not be performed. In this case, a memory device having the structure of FIG. 2 may be obtained. In addition, the above-described manufacturing method may be variously changed in other ways.

Figure 18A:
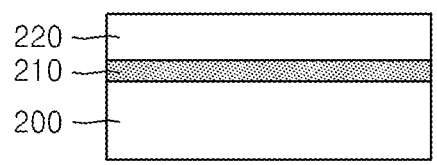
FIGS. 18A to 18C are cross-sectional views illustrating a method of manufacturing a memory device, according to at least one example embodiment.
Figure 18B:
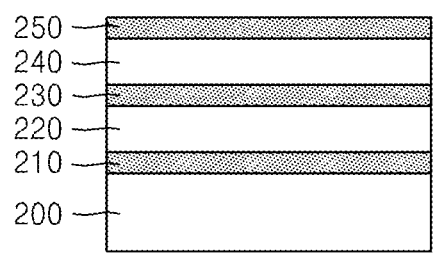
Figure 18C:
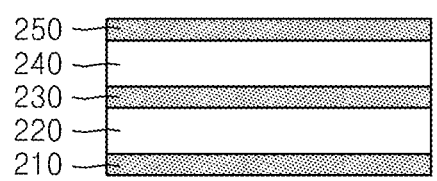

FIGS. 18A to 18C are cross-sectional views illustrating a method of manufacturing a memory device according to another example embodiment.

Referring to FIG. 18A, a first electrode 210 may be formed on a conductor 200. Materials of the conductor 200 and the first electrode 210 may be the same as or similar to those of the conductor 100 and first electrode 110 of FIG. 17A, respectively. The conductor 200 may include catalyst metal such as Cu, Ni, Fe, Co, Pt, or Ru. The first electrode 210 may be formed of graphene, or may be formed of another material (for example, metal or a metal compound) instead of graphene. Although not shown, a substrate may be further provided under the conductor 200.

Next, a 2D semiconductor layer 220 may be formed on the first electrode 210. The 2D semiconductor layer 220 may be formed by the same method as the method of forming the 2D semiconductor layer 140 which has been described above with reference to FIG. 17B. The 2D semiconductor layer 220 may be an n-type semiconductor or a p-type semiconductor which includes a metal chalcogenide-based material.

Referring to FIG. 18B, a graphene layer 230, a capacitor dielectric layer 240, and a second electrode 250 may be sequentially formed on the 2D semiconductor layer 220. The graphene layer 230, the dielectric layer 240, and the second electrode 250 may be the same as or similar to the graphene layer G1, the dielectric layer N1, and the second electrode E2 of FIG. 8, respectively. Thus, the dielectric layer 240 may be formed of an insulating 2D material such as h-BN, or may be formed another material (a dielectric material) instead of a 2D material. The second electrode 250 may be formed of graphene, or may be formed of a conductive material instead of graphene. A method of forming the graphene layer 230, the dielectric layer 240, and the second electrode 250 may be the same as or similar to the method of forming the third electrode 150, the second insulation layer 160, and the fourth electrode 170 in FIG. 17C. The graphene layer 230, the dielectric layer 240, and the second electrode 250 may be formed by the growth method, or may be formed by the transfer method.

Subsequently, as needed, the conductor 200 may be removed from the structure of FIG. 18B. This may be the same as or similar to a process of removing the conductor 100 from the structure of FIG. 17C. A result, which is obtained by removing the conductor 200 from the structure of FIG. 18B, is illustrated in FIG. 18C. In a structure of FIG. 18C, the first electrode 210, the 2D semiconductor layer 220, the graphene layer 230, the dielectric layer 240, and the second electrode 250 may respectively correspond to the first electrode E1, the 2D semiconductor layer S1, the graphene layer G1, the dielectric layer N1, and the second electrode E2 of FIG. 8. All of the first electrode 210, the 2D semiconductor layer 220, the graphene layer 230, the dielectric layer 240, and the second electrode 250 may be formed of a 2D material. Therefore, the device of FIG. 18C may have a low thickness (for example, a thickness of about 10 nm or less), and is flexible and transparent. However, at least one of the first electrode 210, the dielectric layer 240, and the second electrode 250 may not be formed of a 2D material.

A variously modified memory device may be obtained by modifying the manufacturing method of FIGS. 18A to 18C. For example, in the process of FIG. 18A, the first electrode 210 may not be formed, and the 2D semiconductor layer 220 may be formed on the conductor 200. A process of removing the conductor 200 of FIG. 18C may not be performed. In addition, the above-described manufacturing method may be variously changed.

Figure 19A:
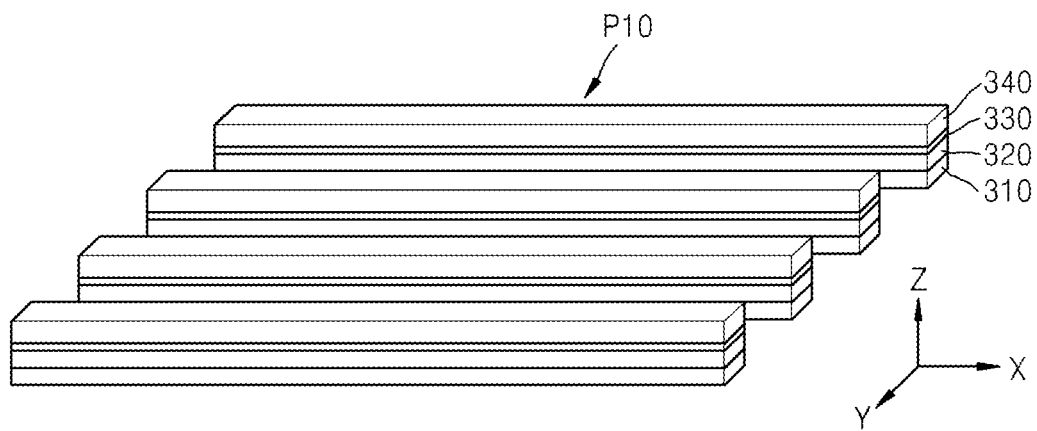
FIGS. 19A to 19C are perspective views illustrating a method of manufacturing a memory device (a memory array), according to at least one example embodiment.
Figure 19B:
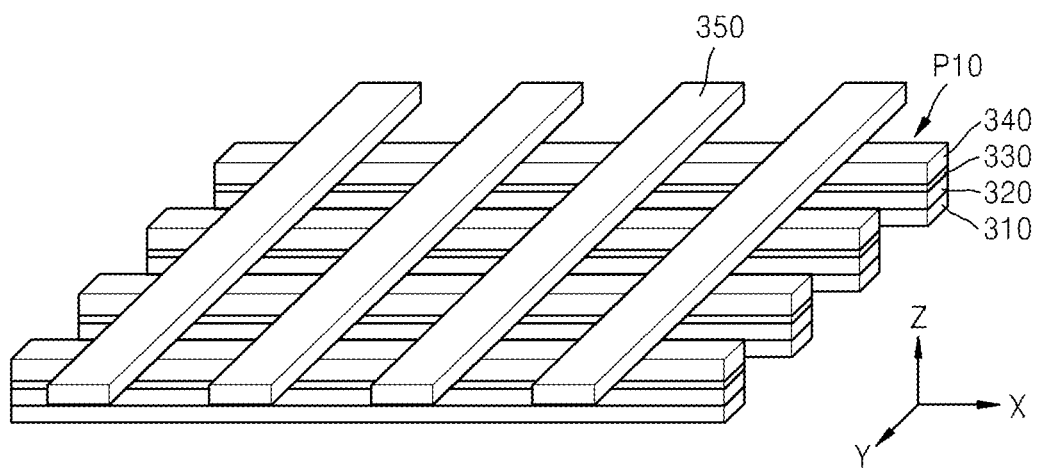
Figure 19C:
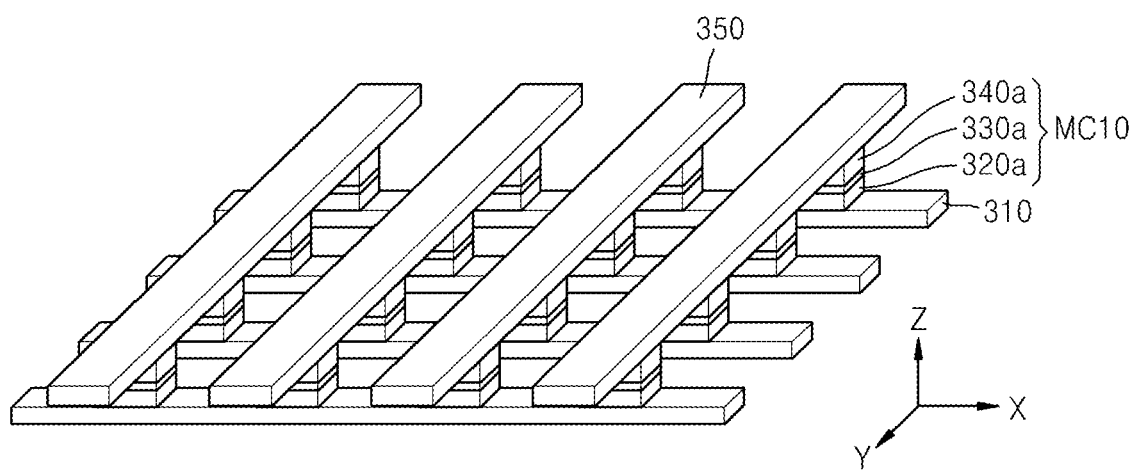

FIGS. 19A to 19C are perspective views illustrating a method of manufacturing a memory device (a memory array) according to another example embodiment.

Referring to FIG. 19A, a plurality of line patterns P10 which extends in a first direction (for example, an X-axis direction) may be formed on a substrate (not shown). Each of the plurality of line patterns P10 may include a first electrode line 310, and moreover include a dielectric layer 320, a graphene layer 330, and a 2D semiconductor layer 340 which are sequentially provided on the first electrode line 310. An electrode material layer, a dielectric material layer, at least one graphene sheet, and a 2D semiconductor thin film may be sequentially formed on the substrate, and then, by patterning the elements in a line type, the plurality of line patterns P10 may be formed. Alternatively, the plurality of line patterns P10 may be formed by growing the material layers in a line type without performing the patterning process. A width of each of the plurality of line patterns P10 may be, for example, several nanometers (nm) to several hundreds of nanometers (nm).

Referring to FIG. 19B, an insulating material layer (not shown) may be formed between and around the plurality of line patterns P10, and a plurality of second electrode lines 350 may be formed on the plurality of line patterns P10 and the insulating material layer. The plurality of second electrode lines 350 may extend in a second direction, for example, in a Y-axis direction. Therefore, the second electrode lines 350 may cross (for example, perpendicularly intersect) the first electrode line 310.

Next, by using the plurality of second electrode lines 350 or a mask pattern (not shown) provided thereon as an etching mask, the 2D semiconductor layer 340, the graphene layer 330, and the dielectric layer 320 which are provided thereunder may be patterned (etched). A result thereof is illustrated in FIG. 19C.

Referring to FIG. 19C, a plurality of the first electrode lines 310 and the plurality of second electrode lines 350 may be arranged to cross each other, and a stacked pattern MC10 corresponding to a memory cell is provided at each of cross points between the first electrode lines 310 and the second electrode lines 350. Hereinafter, the stacked pattern MC10 is referred to as a memory cell. The memory cell MC10 may include a dielectric layer 320*a*, a graphene layer 330*a*, and a 2D semiconductor layer 340*a* which are sequentially provided on the first electrode line 310. The dielectric layer 320*a*, the graphene layer 330*a*, and the 2D semiconductor layer 340*a* are layers obtained by patterning the dielectric layer 320, the graphene layer 330, and the 2D semiconductor layer 340 of FIG. 19B, respectively. The dielectric layer 320*a*, the graphene layer 330*a*, and the 2D semiconductor layer 340*a* may respectively correspond to the dielectric layer N11, the graphene layer G11, and the 2D semiconductor layer S11 of FIG. 14. The dielectric layer 320*a* and the 2D semiconductor layer 340*a* may be switched in position.

A memory array having the structure of FIGS. 14 and 15 may be manufactured by the example method of FIGS. 19A to 19C. The method of FIGS. 19A to 19C is an example, and may be variously modified. Also, although not shown, a plurality of third electrode lines that cross the second electrode lines 350 of FIG. 19C may be further provided on the second electrode lines 350, and a second memory cell may be further provided at each of cross points between the second electrode lines 350 and the third electrode lines. The second memory cell may have the same stacked structure as that of the memory cell MC10, or have a structure (a reverse structure) in which the memory cell MC10 is reversed upside down. In addition, the example method of FIGS. 19A to 19C and a configuration of a memory array manufactured by the method may be variously changed.

As described above, according to the one or more of the above example embodiments, a high-performance memory device based on a 2D material may be easily manufactured. The manufacturing method according to the example embodiments may not use a transfer process, and may be easily applied to a large-area process. Also, according to the above-described method, the memory device according to the example embodiments may be manufactured as a flexible and/or transparent device.

Additionally, each of the 2D semiconductor layers S1, S10, S11, 140, 220 and 340 may have a single-layer structure (a 2D plane structure), or have a structure in which the single-layer structure (the 2D plane structure) is repeatedly stacked. Although the single-layer structure is repeatedly stacked, a characteristic of a 2D material may be maintained. In terms of electric structure, the 2D material may be defined as a material in which a density of state (DOS) follows a quantum well behavior. The DOS may follow the quantum well behavior even in a material where a plurality of 2D unit material layers are stacked (stacked to about 100 layers or less), and thus, the structure in which the single-layer structure (the 2D plane structure) is repeatedly stacked may also be referred to as a 2D material.

Hereinabove, many details are described in detail, but should be construed as an example of a detailed embodiment rather than limiting the scope of the embodiment. For example, it is understood by one of ordinary skill in the art that the configuration of the memory device of each of FIGS. 1 to 3, 8, 9, 14 and 15 may be variously changed. Also, it is understood by one of ordinary skill in the art that the method of operating the memory device described above with reference to each of FIGS. 4 to 7 and 10 to 13 may be variously changed. In addition, it is understood by one of ordinary skill in the art that the method of manufacturing the memory device described above with reference to each of FIGS. 17A to 17D, 18A to 18C and 19A to 19C may be variously changed. Furthermore, the memory device according to the example embodiments may be applied to various electronic devices.

It should be understood that the example embodiments described therein should be considered in a descriptive sense only and not for purposes of limitation. Descriptions of features or aspects within each example embodiment should typically be considered as available for other same or similar features in other example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A memory device comprising:
   a transistor that includes a graphene layer and a two-dimensional (2D) semiconductor layer contacting the graphene layer; and
   a capacitor on the 2D semiconductor layer, the capacitor comprising a capacitor dielectric layer between the graphene layer and an electrode,
   wherein the memory device is configured to store data in the capacitor by using the transistor.

2. The memory device of claim 1, wherein the 2D semiconductor layer comprises a metal chalcogenide-based material.

3. The memory device of claim 1, wherein the 2D semiconductor layer is one of an n-type semiconductor and a p-type semiconductor.

4. The memory device of claim 1, wherein the transistor comprises:
   a first electrode;
   a second electrode separated from the first electrode and including the graphene layer;
   a first insulation layer between the first electrode and the second electrode;
   a third electrode separated from the first insulation layer, the second electrode being between the first insulation layer and the third electrode; and
   the 2D semiconductor layer between the second electrode and the third electrode.

5. The memory device of claim 4, wherein at least one of the first electrode and the third electrode comprises graphene.

6. The memory device of claim 4, wherein the first insulation layer comprises a hexagonal boron nitride (h-BN).

7. The memory device of claim 4, wherein:
   the first electrode, the first insulation layer, and the second electrode have a first width, and
   the 2D semiconductor layer and the third electrode have a second width smaller than the first width.

8. The memory device of claim 4, wherein the capacitor comprises:
   the third electrode;
   a fourth electrode separated from the third electrode; and
   a second insulation layer between the third electrode and the fourth electrode, wherein the second insulation layer comprises the capacitor dielectric layer.

9. The memory device of claim 8, wherein at least one of the third electrode and the fourth electrode comprises graphene.

10. The memory device of claim 8, wherein the second insulation layer comprises a hexagonal boron nitride (h-BN).

11. A memory device comprising:
    a first electrode;
    a second electrode separated from the first electrode;
    a graphene layer between the first and second electrodes;
    a two-dimensional (2D) semiconductor layer between the graphene layer and the first electrode; and
    a capacitor dielectric layer between the graphene layer and the second electrode on the 2D semiconductor layer,
    wherein the memory device is configured to store data by charging the dielectric layer with electric charge.

12. The memory device of claim 11, wherein at least one of the first electrode and the second electrode comprises graphene.

13. The memory device of claim 11, wherein the 2D semiconductor layer is one of an n-type semiconductor and a p-type semiconductor and includes a metal chalcogenide-based material.

14. The memory device of claim 11, wherein the dielectric layer comprises a hexagonal boron nitride (h-BN).

15. A memory device comprising:
    a first electrode;
    a second electrode separated from the first electrode and including a graphene layer;
    a first insulation layer between the first electrode and the second electrode;
    a third electrode separated from the first insulation layer, the second electrode being between the first insulation layer and the third electrode;
    a two-dimensional (2D) semiconductor layer between the second electrode and the third electrode;
    a fourth electrode separated from the 2D semiconductor layer, the third electrode being between the 2D semiconductor layer and the fourth electrode;
    a second insulation layer between the third electrode and the fourth electrode; and
    a capacitor on the 2D semiconductor layer, the capacitor comprising a capacitor dielectric layer between the fourth electrode and the graphene layer.

16. The memory device of claim 15, wherein at least one of the first, third, and fourth electrodes comprises graphene.

17. The memory device of claim 15, wherein at least one of the first and second insulation layers comprises a hexagonal boron nitride (h-BN).

18. The memory device of claim 15, wherein the 2D semiconductor layer is one of an n-type semiconductor and a p-type semiconductor and includes a metal chalcogenide-based material.

19. A memory array comprising:
a plurality of first electrode lines separated from each other;
a plurality of second electrode lines crossing the plurality of first electrode lines; and
a memory cell at each one of cross points between the plurality of first electrode lines and the plurality of second electrode lines, wherein the memory cell comprises:
a graphene layer between the first and second electrode lines;
a capacitor dielectric layer between the graphene layer, and one of the first electrode line and the second electrode line, the capacitor dielectric layer being on a two-dimensional (2D) semiconductor layer; and
the 2D semiconductor layer between the graphene layer and one of the first electrode line and the second electrode line.

20. The memory array of claim 19, wherein the 2D semiconductor layer is one of an n-type semiconductor and a p-type semiconductor and includes a metal chalcogenide-based material.

21. The memory array of claim 19, wherein the dielectric layer comprises a hexagonal boron nitride (h-BN).

22. The memory array of claim 19, wherein one of the first electrode line and the second electrode line adjacent to the 2D semiconductor layer comprises a material having a work function greater than a work function of the graphene layer.

23. The memory array of claim 19, wherein an energy band of the 2D semiconductor layer has an asymmetric barrier structure in an equilibrium state of the memory array.

* * * * *